(12) United States Patent
Fleisch (10) Patent No.: US 10,917,085 B2
(45) Date of Patent: Feb. 9, 2021

(54) METHOD FOR ACTUATING REVERSE-CONDUCTING SEMICONDUCTOR SWITCHES ARRANGED IN PARALLEL

(71) Applicant: Siemens Aktiengesellschaft, Munich (DE)

(72) Inventor: Karl Fleisch, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/322,435

(22) PCT Filed: Jun. 26, 2017

(86) PCT No.: PCT/EP2017/065624
§ 371 (c)(1),
(2) Date: Jan. 31, 2019

(87) PCT Pub. No.: WO2018/024406
PCT Pub. Date: Feb. 8, 2018

(65) Prior Publication Data
US 2019/0207602 A1    Jul. 4, 2019

(30) Foreign Application Priority Data
Aug. 1, 2016 (EP) ..................... 16182202

(51) Int. Cl.
*H03K 17/567* (2006.01)
*H03K 17/13* (2006.01)
(Continued)

(52) U.S. Cl.
CPC .......... *H03K 17/567* (2013.01); *H02M 1/088* (2013.01); *H02M 1/32* (2013.01);
(Continued)

(58) Field of Classification Search
CPC .... H03K 17/567; H03K 17/13; H03K 17/164; H03K 17/127; H03K 17/168; H03K 2217/0009; H02M 1/088; H02M 1/32
See application file for complete search history.

(56) References Cited

U.S. PATENT DOCUMENTS

| 5,399,908 A | 3/1995 | Donaldson |
| 2002/0053897 A1 | 5/2002 | Kajiwara et al. |

(Continued)

FOREIGN PATENT DOCUMENTS

| CN | 1674423 B | 5/2010 |
| CN | 103078616 A | 5/2013 |

(Continued)

OTHER PUBLICATIONS

"Control Method for a Reverse Conducting IGBT", Domes, May 2015, PCIM Europe 2015.*

(Continued)

*Primary Examiner* — Jung Kim
(74) *Attorney, Agent, or Firm* — Henry M. Feiereisen LLC (57) ABSTRACT

In a method for actuating reverse-conducting semiconductor switches, a plurality of reverse-conducting semiconductor switches is arranged in a parallel circuit. Gate contacts of switching elements of at least two of the plurality of reverse-conducting semiconductor switches are controlled by actuating the at least two of the reverse-conducting semiconductor switches at least intermittently with different voltages, thereby allowing to influence a behavior of the switching elements of the at least two of the reverse-conducting semiconductor switches in IGBT (Insulated-Gate-Bipolar-Transistor) and a behavior in diode mode.

12 Claims, 5 Drawing Sheets

(51) Int. Cl.
*H02M 1/088* (2006.01)
*H03K 17/16* (2006.01)
*H03K 17/12* (2006.01)
*H02M 1/32* (2007.01)

(52) U.S. Cl.
CPC .......... *H03K 17/127* (2013.01); *H03K 17/13* (2013.01); *H03K 17/164* (2013.01); *H03K 17/168* (2013.01); *H03K 2217/0009* (2013.01)

(56) References Cited

U.S. PATENT DOCUMENTS

| | | |
|---|---|---|
| 2005/0212497 A1 | 9/2005 | Cha |
| 2012/0307540 A1 | 12/2012 | Tagome |
| 2013/0106469 A1 | 5/2013 | Slavov et al. |
| 2013/0321062 A1 | 12/2013 | Eckel |
| 2016/0218621 A1 | 7/2016 | Hayashi et al. |

FOREIGN PATENT DOCUMENTS

| | | |
|---|---|---|
| DE | 69315903 T2 | 8/1998 |
| DE | 2011 003 938 A1 | 2/2011 |
| EP | 1 028 528 A1 | 8/2000 |
| JP | 2016135070 A | 7/2016 |
| RU | 2249295 C2 | 3/2005 |
| RU | 2549879 C2 | 5/2015 |
| WO | WO 2012-107258 A2 | 8/2012 |
| WO | WO 2015022860 A1 | 2/2015 |

OTHER PUBLICATIONS

PCT International Search Report and Written Opinion of International Searching Authority dated Sep. 15, 2017 corresponding to PCT International Application No. PCT/EP2017/065624 filed Jun. 26, 2017.

* cited by examiner

METHOD FOR ACTUATING REVERSE-CONDUCTING SEMICONDUCTOR SWITCHES ARRANGED IN PARALLEL

CROSS-REFERENCES TO RELATED APPLICATIONS

This application is the U.S. National Stage of International Application No. PCT/EP2017/065624, filed Jun. 26, 2017, which designated the United States and has been published as International Publication No. WO 2018/024406 and which claims the priority of European Patent Application, Serial No. 16182202.8, filed Aug. 1, 2016, pursuant to 35 U.S.C. 119(a)-(d).

BACKGROUND OF THE INVENTION

The invention relates to a method for actuating at least two reverse-conducting semiconductor switches, wherein the at least two reverse-conducting semiconductor switches are arranged in a parallel circuit. The invention also relates to a switching element having at least two reverse-conducting semiconductor switches arranged in a parallel circuit. The invention further relates to a power converter having a series circuit comprising at least two such switching elements.

In reverse-conducting semiconductor switches, the function of the switching element and the diode function are combined in one chip. In particular, IGBTs (insulated gate bipolar transistors) are known as reverse-conducting IGBTs. These are also referred to as RC-IGBTs. In contrast to conventional IGBTs, not only the behavior of the switching element, in this case the IGBT function, but also the behavior in diode mode can be influenced with the aid of the actuation at the gate contact.

DE 10 201 1 003 938 AI discloses a method for controlling two reverse-conducting IGBTs electrically connected in series. This document describes a control method for two IGBTs, connected electrically in series, of a half-bridge, at which an operating DC voltage is present, wherein these reverse-conducting IGBTs have three switching states.

In order to increase the performance, for example of a power converter, a plurality of semiconductor switches can be arranged in a parallel circuit. This parallel circuit makes it possible to increase the current to be switched since the current is distributed among the different branches of the parallel circuit. In this way, the performance of a switching element, for example in a power converter, can be increased since a correspondingly high switchable total current results. In this case, the semiconductor switches serve to connect the load connection, which is also referred to as a phase connection, of the converter to one of the intermediate circuit voltage potentials. Since the semiconductor switches arranged in parallel switch the same phase connection, it has been found to be useful to actuate the semiconductor switches which are arranged in parallel, in each case with the same actuation signal. This occurs both in the case of conventional IGBTs and in the case of reverse-conducting IGBTs.

A reverse-conducting IGBT can assume either the IGBT mode or diode mode depending on the current flow direction. If a current flows from the collector to the emitter, the reverse-conducting IGBT is in IGBT mode. If, on the other hand, the current flows from the emitter to the collector, the reverse-conducting IGBT is in diode mode. When the direction of the load current reverses, the reverse-conducting IGBT changes from diode mode to IGBT mode or from the IGBT mode to diode mode. Therefore, a change in the current direction due to the IGBT causes a change in the corresponding modes. For operation in IGBT mode, a positive gate-emitter voltage is required (open channel for the current flow) while a negative gate-emitter voltage is required for diode mode (closed channel, in order to prevent the electrons from flowing away). Therefore, the zero crossing of the load current, and therefore also the zero crossing of the corresponding current through the semiconductor switch, must be determined with high accuracy since this represents the instant of the change between the modes described. An excessively early or excessively late voltage change at the gate connection can cause damage to the RC-IGBT or falsify the switching state predetermined by the higher-order control in the case of which an incorrect voltage time surface is produced at the output of the converter.

The diodes tend to snap in the case of small load currents. Snapping is also referred to as a snap-action behavior (lack of soft recovery). Due to a very high di/dt of the diode current at the end of the current flow duration, the diodes additionally have a tendency to induce a high voltage which can endanger the component itself and can trigger EMC problems.

In the case of IGBTs which are not reverse-conducting but have a diode parallel to the IGBT, this diode has no control terminal. In this way, the possibility of controlling the stored charge of the diode is absent from the non-reverse-conducting IGBT. Therefore, it is not possible to influence the behavior of these diodes.

If a load current which flows through one semiconductor switch is transferred from said semiconductor switch to another semiconductor switch, then this is referred to as commutation. The reduction of the load current through the one semiconductor switch is also referred to as down-commutation. As soon as the current is extinguished by the semiconductor switch, it is down-commutated.

The invention is based on the object of improving the switching behavior of semiconductor switches arranged in parallel.

SUMMARY OF THE INVENTION

The object is achieved by a method for actuating at least two reverse-conducting semiconductor switches, wherein the at least two reverse-conducting semiconductor switches are arranged in a parallel circuit, wherein at least two of the reverse-conducting semiconductor switches are actuated at least intermittently with a different voltage. The object is also achieved by a switching element having at least two reverse-conducting semiconductor switches arranged in a parallel circuit and an actuating unit or at least a part of an actuating unit for actuating the reverse-conducting semiconductor switches, wherein a current sensor for detecting a load current flowing through the parallel circuit can be connected to a control assembly for evaluating measured values of the current sensor, wherein the individual reverse-conducting semiconductor switches can each be actuated with different voltages by means of the actuating unit or by means of the part of the actuating unit. The object is also achieved by a power converter having at least one series circuit comprising at least two such switching elements, a control assembly for evaluating measured values of the current sensor and a phase connection for connecting a load, wherein a connection point of the two switching elements is electrically connected to the phase connection, wherein the current sensor is arranged between the phase lock and the connection point, wherein the current sensor is connected to the control assembly in order to transmit measurement signals.

Advantageous embodiments of the invention are disclosed in the dependent claims.

The invention is based on the knowledge that the parallel connection of RC-IGBTs can be improved in that the individual parallel semiconductor switches are at least intermittently connected to different gate voltages, in other words different gate-emitter voltage, in order to influence the distribution of the current through the individual semiconductor switches, in particular through the semiconductor switches in diode mode. The inventive solution is based on the one hand, with parallel-connected RC-IGBTs, on actuating the gate-emitter paths of the parallel RC-IGBTs with different gate voltages. Therefore, different collector-emitter currents, and therefore also different stored charges, are established in the individual RC-IGBT, for example in diode mode. The losses, for example the switching losses, can therefore be significantly reduced during operation.

It is particularly advantageous to actuate parallel RC-IGBTs, for example in diode mode, in such a way that at least for the current zero crossing, a part of the RC-IGBTs with negative gate voltage is actuated and the remaining part of the parallel semiconductor switches is actuated with a positive gate voltage. The current direction can therefore be detected considerably more easily, because the requirement for the accuracy of the detection of the current zero crossing is considerably reduced. In this way, it is possible to simplify current direction detection or to save current direction detection and to be relieved of a current measurement which is already present for control purposes. It has been found that the accuracy of the load current measurement, which is already present anyway for control purposes, is sufficient for detecting the zero crossing of the current. An additional precise current measurement with very precise current direction detection directly at the individual parallel circuits of the semiconductor switches, for example within the power converter, can be omitted. Since the current transformers with high accuracy are very expensive, this results in a significant financial advantage.

The proposed method is based on the knowledge that the magnitude of the load current is low in the temporal environment during the change in the direction of the load current, in that not all RC-IGBTs of the parallel circuit are required for conducting this load current. Therefore, in the case of a switch constructed from at least two RC-IGBTs, only a first part of the semiconductor switches in diode mode, what are known as the first semiconductor switches, or at least one first semiconductor switch is actuated with a negative gate voltage and the (remaining) second part of the parallel semiconductor switches, what are known as the second semiconductor switches, or at least one second semiconductor switch is actuated with a positive gate voltage. Therefore, before the zero crossing, the current flows preferably, in other words primarily, through the first semiconductor switch or switches and after the zero crossing the current flows through the second semiconductor switch or switches without having to make a change in the actuation at the gate of the semiconductor switches. Therefore, this instant of the zero crossing also no longer needs to be determined precisely. This is possible, inter alia, since the magnitude of the load current is so low in the vicinity of the zero crossing of the load current that not all the semiconductor switches of the parallel circuit are required for conducting the load current.

Parallel RC-IGBTs in diode mode with different gate-emitter voltages can be actuated by separate actuation channels. The actuation is selected in such a way that, depending on the desired stored charge carrier quantity (therefore, in general depending on the load current) to be conducted, as many RC-IGBTs in diode mode are supplied with a negative actuating voltage (or in other words, the MOS channel is closed) as required. A positive gate-emitter voltage is supplied to the remaining parallel RC-IGBTs in diode mode, which means that they are only involved in the current conducting to a very low extent. This reduces both the switch-on losses of the commutating RC-IGBT in IGBT mode in the same phase and the switch-off losses of the RC-IGBT in diode mode. In addition, the load current is advantageously distributed among a maximum of as many RC-IGBTs in diode mode as are currently necessary, and this prevents a "snapping" of the current with high induced voltages.

Actuating with different signs in the actuating voltage applied to the gate is possible if the magnitude of the current in the vicinity of the zero crossing is so small that not all RC-IGBTs arranged in parallel are required for conducting the current due to the maximum current load capacity. In other words, the vicinity of the zero crossing is defined inter alia in that only some of the semiconductor switches arranged in parallel are required in this temporal environment for carrying the current. The method has proven to be particularly advantageous in particular in the case of a sinusoidal profile of the current, or almost sinusoidal profile of the current, since there is an environment in the vicinity of the zero point at which the values of the current are so small that not all parallel semiconductor switches are required to carry the current and at the same time the slope in the region of the zero point is of such a size that this zero point has to be determined very precisely when all the parallel semiconductor switches are to be actuated in the same way, in order to prevent damage to the semiconductor switch by the rapidly increasing current and an unsuitable actuation.

In particular for the case where the parallel circuit comprises two semiconductor switches, at a current which is less than half of the maximum value, in particular the amplitude in the case of a sinusoidal profile, in each case one semiconductor switch is actuated with a positive gate voltage and the second semiconductor is actuated with a negative gate voltage.

This consideration can readily be transferred to the IGBT mode. In this case too, a first part of the semiconductor which is arranged in parallel can be actuated with a negative gate voltage, and the second (remaining) part with a positive gate voltage before a zero crossing, in other words a change of the RC-IGBTs from IGBT mode into diode mode. This actuation also means that precise detection of the current zero crossing is no longer required. Before the zero crossing, the load current flows through the second semiconductor switches and after the zero crossing through the first semiconductor switches without switching operations, in other words changes in the gate voltages of the semiconductor switches, being required for the zero crossing. In this way, in each case before and after the zero crossing of the load current, the other part respectively conducts the current through the parallel circuit. By way of the relatively small di/dt of the load current (a few A/µs) sufficient time remains to also provide superordinate electronics, which are otherwise used for control tasks, which can take over the current direction detection. Therefore, a plurality of RC-IGBTs in IGBT mode or conventional IGBTs, which are arranged in parallel, can also be actuated separately. As a result, the charge carrier quantity of parallel IGBTs can also be set and switch-off losses can be reduced in IGBT mode. An excessively high di/dt in the case of small load currents can also be prevented by the separate actuation. For this purpose, only as many RC-IGBTs in IGBT mode or standard IGBTs are actuated in the case of small load currents with positive gate-emitter voltage as are required for the current flow. This increases the current density in the current-conducting IGBTs.

In addition to actuating the first semiconductor switches and the second semiconductor switches with voltages which have a different sign, it is likewise possible to actuate the first semiconductor switches and the second semiconductor switches with a voltage having the same sign and a different magnitude. The current distribution among the individual semiconductor switches of the parallel circuit can therefore be optimized. For example, semiconductor switches which are subjected to better cooling can therefore be assigned a higher current and other semiconductor switches with poorer cooling, a lower current.

Particularly advantageous is the use of a switching element of this kind if two of these switching elements are arranged in a series circuit and therefore result in a converter having a phase. The connection point of the series circuit is in this case the load connection through which the load current flows. The load connection can then be electrically connected to the one end or to the other end of the phase module. An intermediate circuit capacitor is arranged at the two ends of the series circuit. The two ends therefore usually have, in other words as soon as the capacitor is charged to a voltage, different electrical potentials. These potentials are also referred to as intermediate circuit potentials. For example, by means of a pulse width modulation, any electrical potential can be generated at the load connection at the time average, which is between the two intermediate circuit potentials. Therefore, in a simple manner, a phase of a converter or, when using a plurality of phases, a multi-phase converter can be achieved in a simple and cost-effective manner.

In an advantageous embodiment of the invention, at least intermittently at least one first semiconductor switch of the at least two reverse-conducting semiconductor switches is actuated with a negative voltage and at least one second semiconductor switch of the at least two reverse-conducting semiconductor switches is actuated with a positive voltage. In this way, all of the aforementioned advantages can be achieved. The different sign clearly defines which semiconductor switches in the parallel circuit conduct a current and which do not. The distribution of the currents among the individual parallel semiconductor switches can therefore be determined in a simple manner. A further advantage, before an imminent change in direction, also referred to as sign change, of the load current of using only a part of the semiconductor switches for conducting the current consists in that the current is then higher in the individual semiconductor switches than when the current flows through all the semiconductor switches arranged in parallel. In this way, at the same time the current through a semiconductor switch can be preventing from falling below a minimum value and being broken off. By way of the actuation, the region of a possible snapping of the diode current can be displaced towards smaller load currents and thereby significantly loses importance.

In a further advantageous embodiment of the invention, the parallel circuit has a plurality of reverse-conducting semiconductor switches, wherein the number of first semiconductor switches and/or the number of second semiconductor switches is determined as a function of the load current. The number of semiconductor switches involved in the current conduction can be adapted at any instant such that they are not overloaded due to an excessively high current. At the same time, such a high current (minimum current) is ensured that the current does not snap due to the snapping behavior. The RC-IGBT must, if it is intended to carry a current, always be actuated with the associated actuating voltage at the gate-emitter path depending on the current direction. Otherwise, either the RC-IGBT in IGBT mode is not switched on with negative gate-emitter voltage, or in diode mode with positive gate-emitter voltage is damaged by current concentration at individual chips or regions of chips. The correct gate-emitter voltage must be set very close to the natural current zero crossing of the load current RC-IGBT current by way of a current direction detection. In parallel operation of two or more RC-IGBTs, one or more RC-IGBTs with positive and one or more RC-IGBTs with negative gate-emitter voltage can be actuated in the vicinity of the current zero crossing. If the current now flows in the diode direction, the RC-IGBT with negative gate-emitter voltage will take over this current. The RC-IGBT with positive gate-emitter voltage is not involved with the current flow due to its much higher forward voltage. Conversely, in the case of a current flow in the IGBT direction (from C to E) only the RC-IGBT having positive gate-emitter voltage conducts the current. Only when the load current has increased to such an extent that both or all RC-IGBTs are used for current conduction does the gate-emitter voltage of all the required RC-IGBTs have to be set so as to be equal, in accordance with the current direction. Current direction detection can therefore be simplified considerably because the requirement for accuracy can be greatly reduced. It has been found that a current measuring device already present for control purposes can take over this task.

In a further advantageous embodiment of the invention, the reverse-conducting semiconductor switches of the parallel circuit are in diode mode, wherein all the reverse-conducting semiconductor switches arranged in the parallel circuit are actuated with a negative voltage up to a first instant $t_1$, wherein after the first instant $t_1$ and before a second instant $t_2$, the first semiconductor switches of the reverse-conducting semiconductor switches arranged in the parallel circuit are actuated with a negative voltage and the second semiconductor switches of the reverse-conducting semiconductor switches arranged in the parallel circuit are actuated with a positive voltage, wherein the first instant $t_1$ is before the second instant $t_2$, wherein the second instant $t_2$ corresponds to an instant at which the load current is down-commutated from the reverse-conducting semiconductor switches. Parallel RC-IGBTs can be actuated by means of separate control channels in diode mode with different gate-emitter voltages. The actuation is selected in such a way that, in the event of small load currents, a positive gate-emitter voltage (desaturation pulse) is supplied to a permissible part of the parallel RC-IGBT after a certain time $t_1$ before the imminent commutation and to the remaining part of the RC-IGBT in diode mode only from a time $t_2$. In the period between $t_1$ and $t_2$, the load current is shifted to the RC-IGBTs in diode mode, which still have no positive gate-emitter voltage. A part of the parallel RC-IGBTs is therefore relieved in diode mode and dissipates its stored charge as early as at this instant. During commutation, only considerably less stored charge has to be dissipated. A "snapping" of the current can also be prevented in this way.

In a further advantageous embodiment of the invention, the parallel circuit has at least three reverse-conducting semiconductor switches, which are in diode mode, wherein the actuation of at least one third semiconductor switch of the reverse-conducting semiconductor switches changes from a negative voltage to a positive voltage with decreasing magnitude of the load current. By means of the circuit with decreasing current magnitude, it can be ensured that, in particular in the case of sinusoidal currents, an overload due to a short-term and unexpected current increase is avoided. As a result of the decreasing magnitude, it is also possible to ensure that a current is established in the conductive semiconductor switches in a region in which damage to one of the conductive semiconductor switches is reliably excluded.

In a further advantageous embodiment of the invention, in the event of an imminent change in the reverse-conducting semiconductor switch from diode mode to IGBT mode, in particular at the instant of a zero crossing of the load current, precisely one reverse-conducting semiconductor switch is actuated with a negative voltage, and the other semiconductor switches of the semiconductor switches arranged in the parallel circuit are actuated with a positive voltage. As a result of the decreasing load current and the therefore decreasing current through the parallel circuit, a current value is reached at an instant at which a single semiconductor switch is capable of conducting this current. The other semiconductor switches can already be prepared for IGBT mode by means of a positive voltage. Therefore, precise knowledge of the change between the modes is no longer required.

In a further advantageous embodiment of the invention, the different reverse-conducting semiconductor switches are actuated at least intermittently in a staggered manner with respect to one another. A simple possibility for allowing the switching operations to take place not at the same time but in succession is to provide a fixed time offset between the actuating voltages of the individual parallel reverse-conducting semiconductor switches. Alternatively, the time offset can also be dependent on the value of the load current, in particular the magnitude, the frequency or the phase position of the load current. As a result of the time offset, a snapping of the current, in particular in diode operation, can be reliably avoided. In this case, the dependence can be determined on the basis of a measured or estimated current value. Precisely in the case of a sinusoidal profile, the current profile can be sufficiently well estimated, for example for the next half or whole period duration, that it is possible to dispense with the evaluation of precise measurement values.

Due to the staggered actuation, the switching losses occur in a time offset manner, so the resulting heat can be better dissipated. Furthermore, the formation of losses can be influenced. In this case, it has been found to be advantageous to switch off a high current through a semiconductor switch instead of switching off a mean current through two semiconductor switches. Therefore, switching losses can be reduced overall by the staggered switching.

BRIEF DESCRIPTION OF THE DRAWING

The invention will be described and explained in more detail below with reference to the exemplary embodiments illustrated in the figures, in which.

DETAILED DESCRIPTION OF PREFERRED EMBODIMENTS

Figure 1:
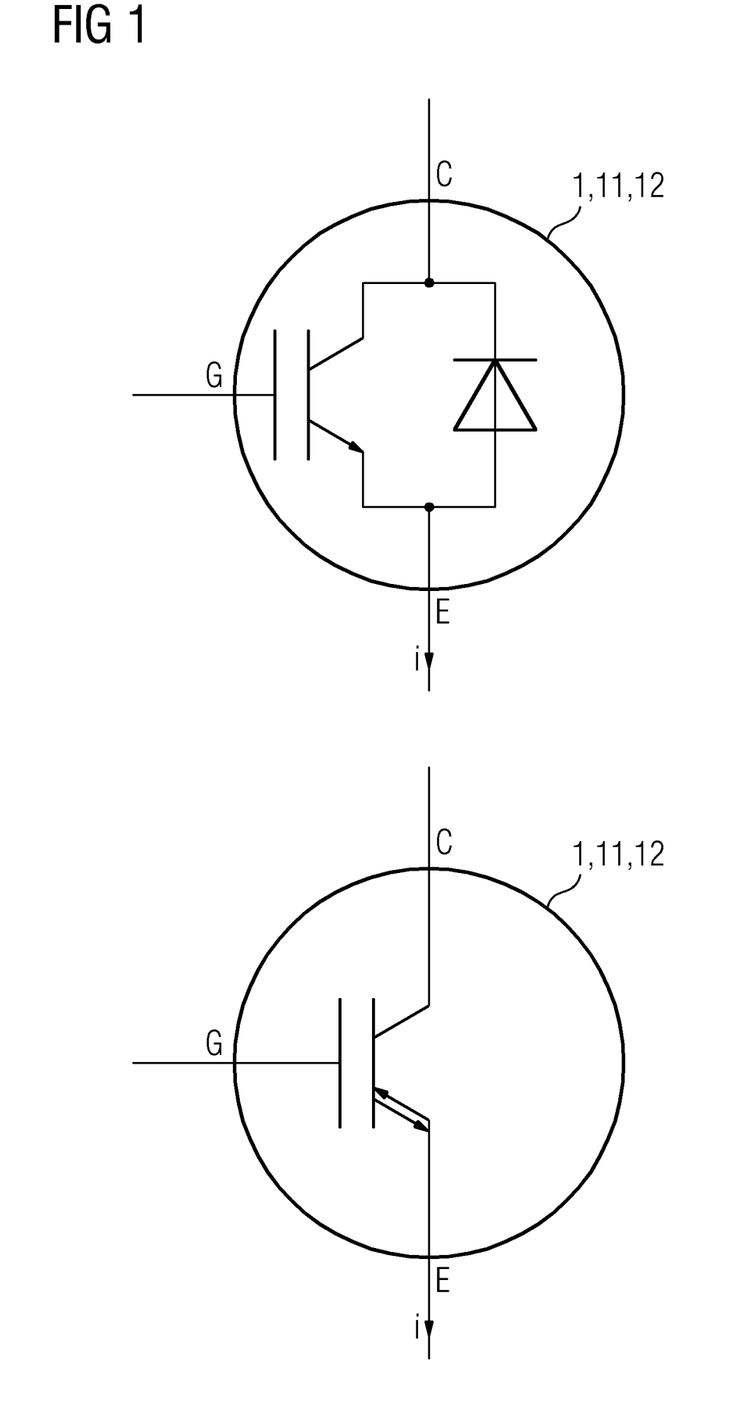
FIG. 1 shows a reverse-conducting IGBT (RC-IGBT)

FIG. 1 shows in the upper part the functional illustration of a reverse-conducting semiconductor switch 1, designed as an RC-IGBT. A parallel circuit comprising an IGBT and a diode is located between the collector C and the emitter E. Said parallel circuit is arranged on a chip. The result of this is that the gate connection, in particular with the applied voltage between gate G and emitter E, can not only influence the behavior of the IGBT switch, but also the behavior of the diode. Depending on whether the semiconductor switch 1 is actuated with a positive or with a negative voltage between gate G and emitter E, it forms part of the group of first semiconductor switches 11 (negative actuation) or the group of the second semiconductor switches 12 (positive actuation). The current i through the RC-IGBT is therefore defined in that a current flow from collector C to emitter E has a positive sign. Therefore, an RC-IGBT having a positive current i is in IGBT mode and an RC-IGBT having a negative current i is in diode mode. The lower part indicates the circuit symbol of an RC-IGBT which has the above-described functions.

Figure 2:
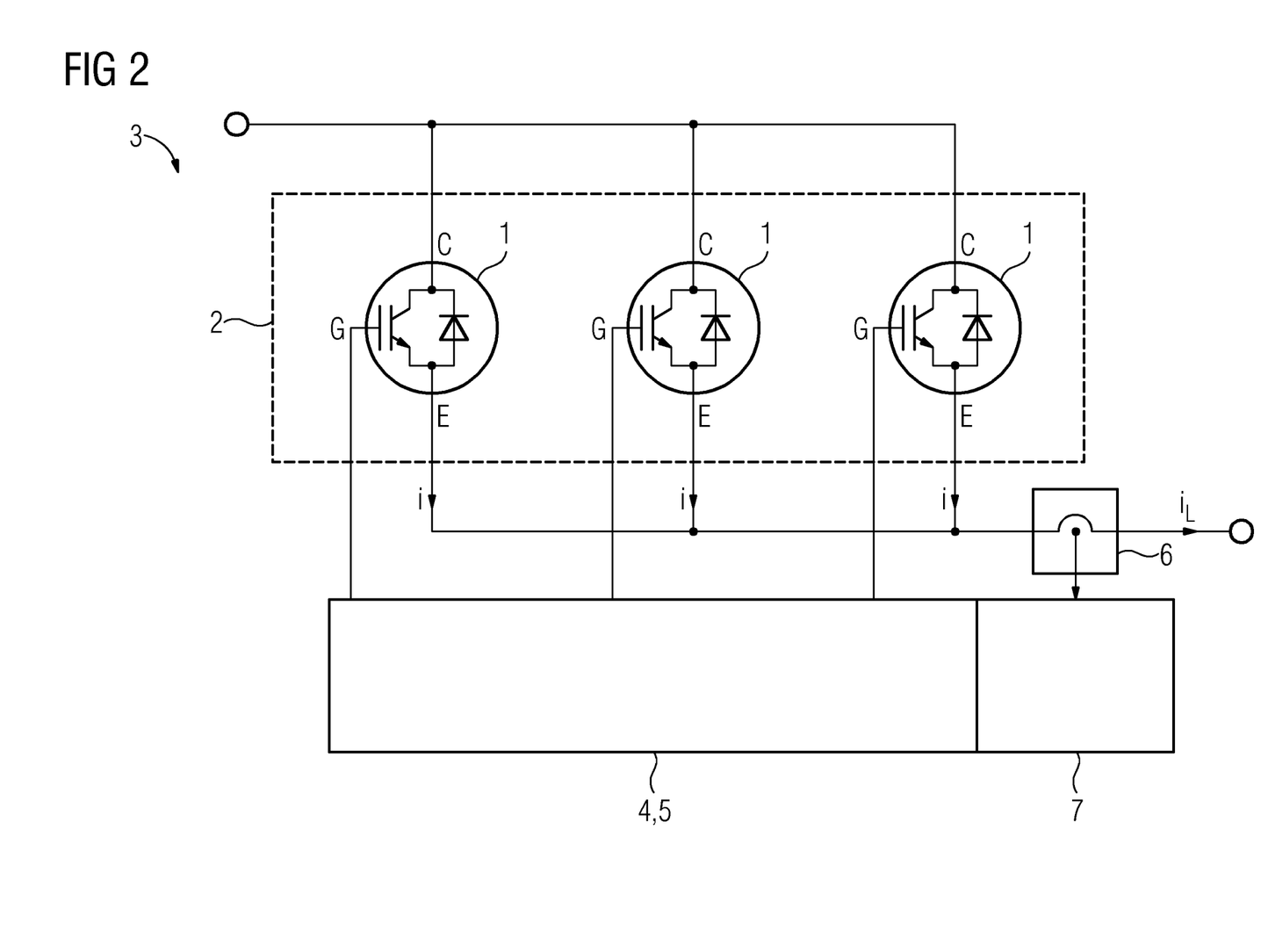
FIG. 2 shows a switching element.

FIG. 2 shows a switching element 3 having a parallel circuit 2 comprising three semiconductor switches 1. The semiconductor switches 1, designed as RC-IGBTs, are actuated via their gate connection G by the actuating unit 4 or parts 5 of the actuating unit 4. The actuating unit 4 or parts 5 of the actuating unit 4 generate(s) its actuation commands on the basis of signals from the control assembly 7. Measured values of the current sensor 6, which measures the load current $i_L$, are in turn included in the control assembly 7. The load current $i_L$ is composed of a sum of the currents i through the individual parallel semiconductor switches 1.

Figure 3:
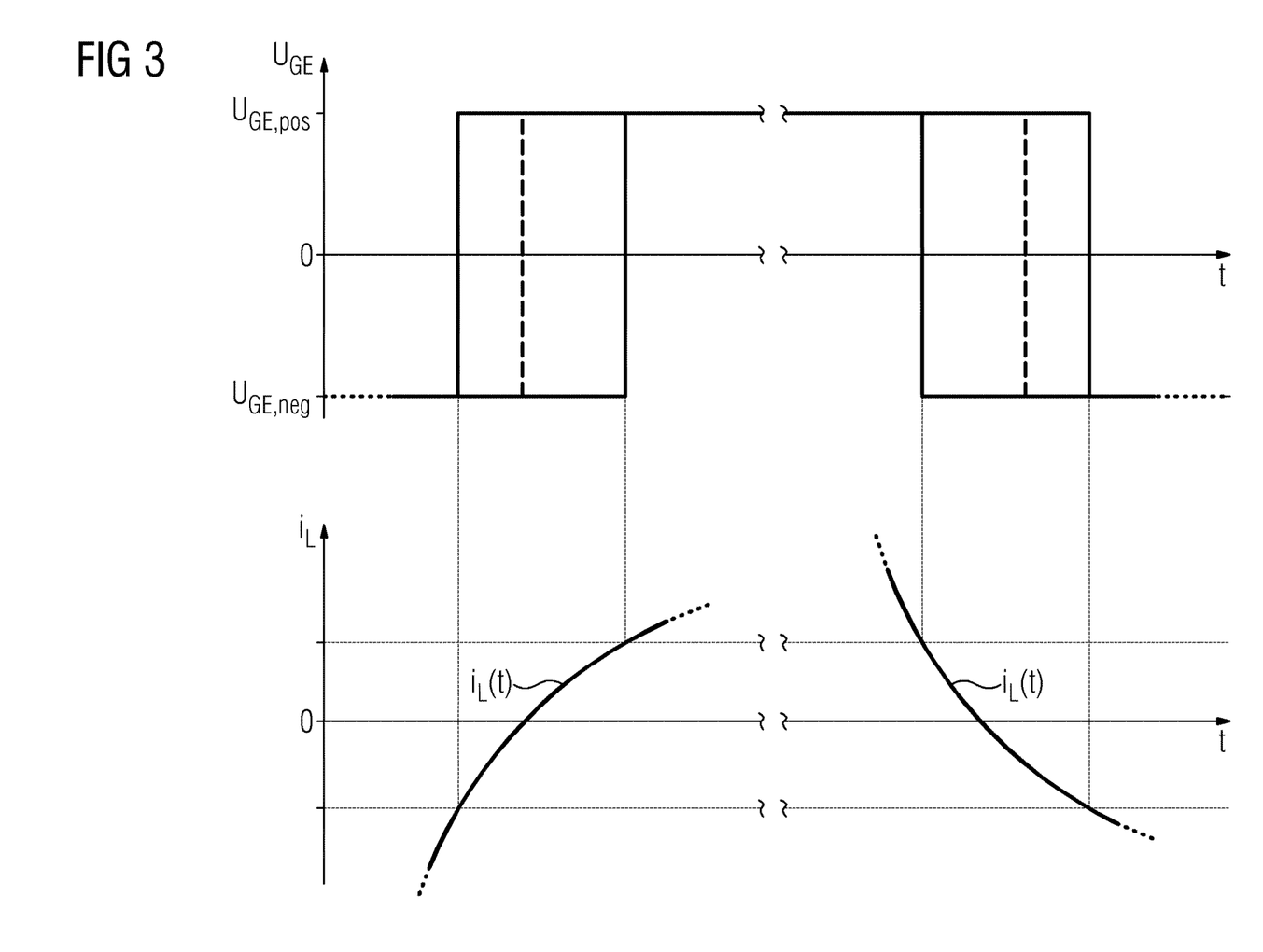
FIG. 3 shows a time curve of actuation of parallel RC-IGBTs

FIG. 3 shows the time curve of the actuating voltage $U_{GE}$ and of the load current $i_L$ as a function of the time t for a parallel circuit 2 comprising three semiconductor switches 1. These time curves can therefore correspond, for example, to an operation of the switching element 3 illustrated in FIG. 2. In the case of negative load current $i_L$, as illustrated on the left side of FIG. 3, the semiconductor switches 1 illustrated there are in diode mode since the diode takes over the conduction of the current i in the interior of the RC-IGBT. As the magnitude of the current $i_L$ becomes smaller, all three semiconductor switches 1 are no longer required for conducting the current. In this case, it is possible for two of the semiconductor switches 1 to conduct the current without being overloaded. These two semiconductor switches 1 are then referred to as first semiconductor switch 11. The additional semiconductor switch, which is still present in this parallel circuit 2, is not required for conducting the current and can be actuated by means of a positive actuating voltage $U_{GE,pos}$, so it does not conduct any current or only a small current. As a result of the positive actuation of this semiconductor switch 1, it is regarded as being associated with the group of the second semiconductor switches 12. If the magnitude of the current $i_L$ falls further, one of the first semiconductor switches can likewise assume a positive actuating voltage, so it no longer carries the load current. In this case, only one semiconductor switch 1 is then still present in the group of first semiconductor switches 11. The magnitude of the load current $i_L$ is then low such that just this one semiconductor switch 1 is sufficient for conducting the entire load current $i_L$. The two other semiconductor switches 1 are now in the group of the second semiconductor switches 12 and experience a positive actuation at the gate G therefore. They are not current-carrying in diode mode therefore. If the load current $i_L$ reaches the value zero, in other words it intersects the time axis t in the graph, the semiconductor switches 1 change from diode mode to IGBT mode. The semiconductor switches 1 of the group of second semiconductor switches 12 already present with a positive actuating voltage now take over the load current $i_L$. Therefore, a switching of the last remaining first semiconductor switch 11 at the instant of the zero crossing is not required and can be effected later since the semiconductor switches 1 of the group of the second semiconductor switches 12 can take over the current at the instant of the zero crossing without any problems and without a risk of damage. Actuation of the semiconductor switch 1 with negative actuating voltage can now be carried out after the sign change of the load current $i_L$, in other words once the load current has assumed positive values.

The right-hand part of FIG. 3 shows the transition from IGBT mode to diode mode. As the magnitude of the current $i_L$ becomes smaller, all three semiconductor switches 1 are no longer required here for conducting the current. In this case, it is possible for two of the semiconductor switches 1 to conduct the current without being overloaded. The additional semiconductor switch 1 still present in this parallel circuit 2 is not required for conducting the current and can be actuated by means of a negative actuating voltage $U_{GE,neg}$, so it does not carry any current or only a small current. If the magnitude of the current $i_L$ falls further, a further semiconductor switch can likewise have a negative actuating voltage applied to it, so it no longer carries the load current. In this case, only one semiconductor switch 1 is then still current-carrying. If the load current $i_L$ reaches the value zero, in other words it intersects the time axis t in the graph, the semiconductor switches 1 switch from IGBT mode to diode mode. The semiconductor switches which have already been actuated with a negative actuating voltage now take over the load current $i_L$. Therefore, switching at the precise instant of the sign change of the load current $i_L$ and therefore precise knowledge about the moment of the zero crossing is no longer required.

In order to keep the actuating effort low, two of the three semiconductors illustrated here can also be switched to a positive gate voltage at an instant, as soon as the load current can be conducted from the one remaining semiconductor with negative gate voltage. For this reason, the mean switching action respectively is represented by dashed lines in FIG. 3 since, optionally, if the magnitude of the current is already sufficiently small it can take place simultaneously with the preceding switching action.

Due to the staggered switching, precise knowledge of the zero crossing of the load current $i_L$ is no longer required. The load current $i_L$ of semiconductor switches 1 of the series circuit 2 can be conducted both before and after the zero crossing. In this way, accurate detection of the current zero crossing, which is otherwise often encountered in RC-IGBTs, in which all RC-IGBTs change the actuating voltage at the gate, is omitted. Furthermore, the distribution of the load current $i_L$ among only a few or only one semiconductor switch 1 ensures that the current through the semiconductor switch 1 is sufficiently large to prevent the current from being broken off. It is likewise possible to carry out this method, in other words the staggered actuation of the individual semiconductor switches 1 of a parallel circuit 2, also for the transition from IGBT mode to diode mode. In this case, the voltages for actuation are successively changed from a positive control $U_{GE,pos}$ to a negative actuating voltage $U_{GE,neg}$.

Figure 4:
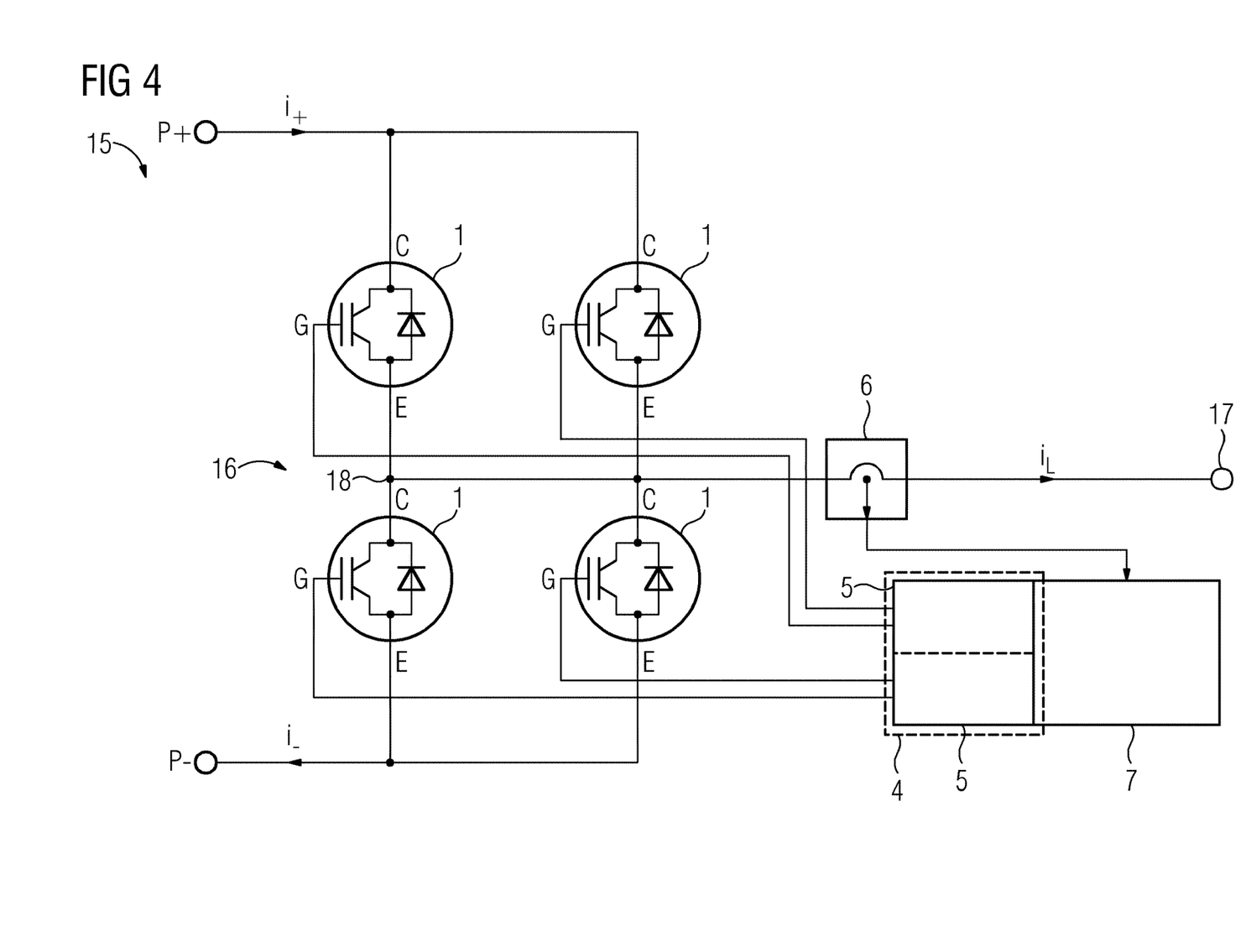
FIG. 4 shows a power converter and
FIG. 5 shows a time curve of actuation during commutation

FIG. 4 shows an exemplary embodiment of a converter 15 with a series circuit 16 comprising two parallel circuits 2, wherein the individual parallel circuits 2 each have two semiconductor switches 1. The connection point 18 of the series circuit forms the phase connection 17. A current sensor 6 for measuring the load current $i_L$ is arranged in the phase connection 17. The current sensor 6 transmits its measured values to a control assembly 7. The control assembly 7 is connected to an actuating unit 4. In this exemplary embodiment, the actuating unit 4 is formed by two parts 5 of an actuating unit 4. A first part 5 of the actuating unit 4 controls the semiconductor switches 1, which are connected to a positive intermediate circuit potential P+. A further part 5 of the actuating unit 4 actuates the semiconductor switches 1 which are connected to the negative potential P– of the intermediate circuit. The identified currents i+ and i– flow in the respective semiconductor switches 1 from the collector to the emitter. A positive current i+ and i– therefore represents operation in IGBT mode and a negative current of i+ and i– represents operation in diode mode of the respective semiconductor switch 1. The converter 15 illustrated here can be expanded by further phases with in each case further phase connections 17, wherein the further phases can also be regulated and controlled by the control assembly 7. The individual phases are connected to one another at their intermediate circuit potentials P+ and P–. The converters 15 frequently have three phase connections 17 for a three-phase system. Furthermore, it is possible, with two phase connections, to provide a phase connection for one phase and a second phase connection for a neutral conductor.

In order to supply electrical energy to a load connected to the phase connection 17, the phase connection 17 is connected to one of the two intermediate circuit potentials P+ or P–. This occurs via the respective parallel circuit 2 of semiconductor switches 1. In this case, pulse width modulation is used, for example. Therefore, either the semiconductor switches 1 connected to the positive intermediate circuit potential P+ are conductive or the semiconductor switches 1 connected to the negative potential P– are conductive. The state where both the semiconductor switches connected to the positive potential and the semiconductor switches connected to the negative potential are conductive does not necessarily have to be avoided since otherwise a short circuit occurs in the intermediate circuit in which the two potentials P+ and P– are connected. This would lead to high short-circuit currents. Switching of the conductivity between the semiconductor switches 1, which are connected to the positive intermediate circuit potential P+, and the semiconductor switches 1, which are connected to the negative potential P– of the intermediate circuit, is referred to as commutation. The process of switching off is referred to as down-commutation.

Figure 5:
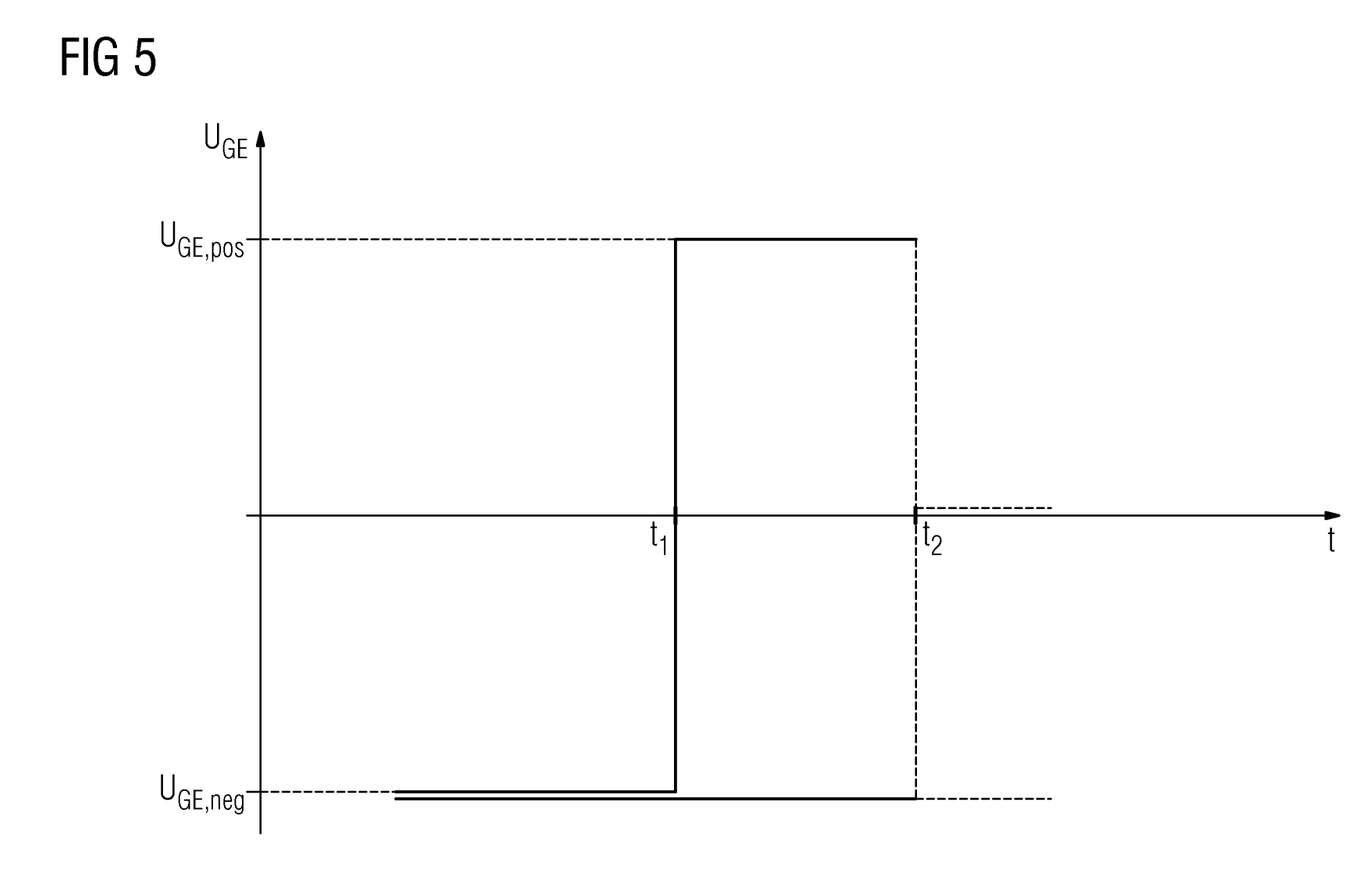

FIG. 5 shows the time curve of actuation of the semiconductor switches 1 of the parallel circuit 2 during commutation in an arrangement according to FIG. 4. In this case, the semiconductor switches 1 from the parallel circuit 2 are in diode mode. This is the case with the semiconductor switches 1 connected to the positive potential P+ of the intermediate circuit when the load current $i_L$ is negative or with the semiconductor switches 1 which are connected to the negative potential P– of the intermediate circuit when the load current $i_L$ is positive. The semiconductor switches 1 are actuated with a negative actuating voltage $U_{GE,neg}$ in order to be able to implement diode operation. At an instant $t_1$, the actuation of at least one semiconductor switch 1 changes from a negative voltage to a positive voltage. Should the parallel circuit 2 have more than two semiconductor switches 1, a plurality of semiconductor switches 1 can change their actuating voltage from a negative voltage to a positive voltage one after the other or at the same time (less actuation effort). Only as many semiconductor switches 1 are actuated with negative voltage as are required in order to conduct the load current $i_L$. This also ensures that the current i is reliably prevented from being broken off by the semiconductor switch 1. At the instant $t_2$, which is later than $t_1$, the commutation is to take place on the respective other semiconductor switches of the series circuit. The semiconductor switches which are then in diode mode output the current. In this case, it must then be ensured that these semiconductor switches 1 of the parallel circuit 2 are not actuated with a positive actuating voltage. This is to be avoided since the semiconductor switches of the other part of the series circuit, which are then operated in IGBT mode, are actuated with a positive gate voltage after commutation. Therefore, the semiconductor switches, in which the current is down-commutated, may no longer be actuated with a positive gate voltage since otherwise a short circuit could occur in the intermediate circuit. It is possible to actuate the semiconductor switches 1 from which the current is down-commutated with any negative voltage or also with the voltage 0.

To summarize, the invention relates to a method for actuating at least two reverse-conducting semiconductor switches, wherein the at least two reverse-conducting semiconductor switches are arranged in a parallel circuit. In order to improve the switching behavior, it is proposed to actuate at least two of the reverse-conducting semiconductor switches arranged in a parallel circuit at least intermittently with a different voltage. The invention relates to a further switching element comprising two reverse-conducting semiconductor switches arranged in a parallel circuit and a actuating unit or at least a part of an actuating unit for actuating the reverse-conducting semiconductor switches, wherein a current sensor for detecting a load current flowing through the parallel circuit can be connected to a control assembly for evaluating measured values of the current sensor, wherein the individual reverse-conducting semiconductor switches can each be actuated with different voltages by means of the actuating unit or by means of the part of actuating unit.

The invention claimed is:

1. A method comprising:
   arranging a plurality of reverse-conducting semiconductor switches in a parallel circuit;
   controlling gate contacts of switching elements of the plurality of reverse-conducting semiconductor switches, with a positive gate voltage with respect to emitters of the plurality of reverse-conducting semiconductor switches placing the reverse-conducting semiconductor switches in IGBT (insulated-Gate-Bipolar-Transistor) mode and with a negative gate voltage with respect to emitters of the plurality of reverse-conducting semiconductor switches placing the reverse-conducting semiconductor switches in diode mode; and
   adjusting a number of the parallel connected reverse-conducting semiconductor switches to be controlled in diode mode and the number of the parallel connected reverse-conducting semiconductor switches to be controlled in IGBT mode such that a load current is distributed over not more semiconductor switches than required to carry the load current and to prevent snapping of the load current,
   while the reverse-conducting semiconductor switches are in the diode mode and when a bad current of a first polarity conducted by the plurality of reverse-conducting semiconductor switches is down-commutated to a value that can be carried by a lesser number of reverse-conducting semiconductor switches in diode mode, applying a positive voltage to the gate contact of at least one of the reverse-concluding semiconductor switches in diode mode to switch the at least one reverse-conducting semiconductor switch from diode mode into IGBT mode, wherein the at least one reverse-conducting semiconductor switch switched into IGBT mode is non-conducting,
   when the polarity of the load current changes from the first polarity to an opposite second polarity, conducting the load current with the at least one reverse-conducting semiconductor switch that had previously been switched to IGBT mode and applying a positive voltage to the gate contact of the reverse-conducting semiconductor switch that had remained in diode mode to switch the reverse-conducting semiconductor switch from diode mode into IGBT mode.

2. The method of claim 1, wherein the at least one reverse-conducting semiconductor switch in diode mode is switched from diode mode to IGBT mode at a first point in time occurring before the polarity of the load current changes and the reverse-conducting semiconductor switch that had remained in diode mode is switched to IGBT mode at a second point in time which is later than the first point of time and occurs after the polarity of the load current changes.

3. The method of claim 1, wherein the number of reverse-conducting semiconductor switches in diode mode is selected commensurate with a magnitude of the load current of the first polarity.

4. The method of claim 1, further comprising in the event of an imminent change of the plurality of reverse-conducting semiconductor switches from the diode mode to the IGBT mode, actuating precisely one of the plurality of reverse-conducting semiconductor switches with the negative voltage, and actuating the remaining semiconductor switches with the positive voltage.

5. The method of claim 4, wherein the change of the reverse-conducting semiconductor switches from the diode mode to the IGBT mode occurs before a zero crossing of the load current from the first polarity to the second polarity.

6. The method of claim 3, wherein the number of reverse-conducting semiconductor switches in diode mode is reduced in a staggered manner.

7. The method of claim 1, further comprising:
   while the reverse-conducting semiconductor switches are in the IGBT mode and when a load current of a second polarity conducted by the plurality of reverse-conducting semiconductor switches is down-commutated to a value that can be carried by a lesser number of reverse-conducting semiconductor switches, applying a negative voltage to the gate contact of at least one of the reverse-conducting semiconductor switches in IGBT mode to switch the at least one reverse-conducting semiconductor switch from IGBT mode into diode mode, wherein the at least one reverse-conducting semiconductor switch switched into diode mode is non-conducting, when a polarity of the load current changes from the second polarity to an opposite first polarity, conducting the load current with the at least one reverse-conducting semiconductor switch that had previously been switched to diode mode and applying a negative voltage to the gate contact of the reverse-conducting semiconductor switch that had remained in IGBT mode to switch the reverse-conducting semiconductor switch from IGBT mode into diode mode.

8. The method of claim 7, wherein the at least one reverse-conducting semiconductor switch in IGBT mode is switched from IGBT mode to diode mode at a first point in time occurring before the polarity of the load current changes and the reverse-conducting semiconductor switch that had remained in IGBT mode is switched to diode mode at a second point in time which is later than the first point of time and occurs after the polarity of the load current changes.

9. The method of claim 7, wherein the number of reverse-conducting semiconductor switches in IGBT mode is selected commensurate with a magnitude of the load current of the second polarity.

10. The method of claim 7, further comprising in the event of an imminent change of the plurality of reverse-conducting semiconductor switches from the IGBT mode to the diode mode, actuating precisely one of the plurality of reverse-conducting semiconductor switches with the positive voltage, and actuating the remaining semiconductor switches with the negative voltage.

11. The method of claim 10, wherein the change of the reverse-conducting semiconductor switches from the IGBT mode to the diode mode occurs before a zero crossing of the load current from the second polarity to the first polarity.

12. The method of claim 9, wherein the number of reverse-conducting semiconductor switches in IGBT mode is reduced in a staggered manner.

\* \* \* \* \*